United States Patent [19]

Lacher

[11] 3,921,007

[45] Nov. 18, 1975

[54] STANDARDIZING LOGIC GATE

[75] Inventor: William A. Lacher, Lansdale, Pa.

[73] Assignee: Burroughs Corporation, Detroit, Mich.

[22] Filed: Apr. 8, 1974

[21] Appl. No.: 458,377

[52] U.S. Cl. .............................. 307/218; 307/299 A

[51] Int. Cl.² .......................................... H03K 19/22

[58] Field of Search ........ 307/215, 218, 289, 299 A

[56] References Cited

UNITED STATES PATENTS

| | | | |
|---|---|---|---|
| 3,641,362 | 2/1972 | Gamble | 307/218 X |
| 3,719,830 | 3/1973 | Ananiades | 307/218 |
| 3,795,822 | 3/1974 | Skokan | 307/218 X |

*Primary Examiner*—James B. Mullins

*Attorney, Agent, or Firm*—Kevin R. Peterson; Edward J. Feeney, Jr.; Edmund M. Chung

[57] ABSTRACT

A logic circuit including a first multi-emitter input transistor for determining a logical AND function of input signals, a second multi-emitter transistor for amplifying the logical AND function and isolating the collector reactance and base circuitry of the input transistor from the remainder of the logic circuit, an output amplifier for transferring the amplified logical function to succeeding logic stages, and level shifting circuitry for preventing deterioration of the signal level of the output of the logic circuit. The level shifting circuitry includes elements for determining the input level necessary for initiating the level-shifting, a constant current sink and a current source.

4 Claims, 2 Drawing Figures

STANDARDIZING LOGIC GATE

BACKGROUND OF THE INVENTION

This invention relates generally to an improved logic circuit which is suitable for integrated circuit fabrication for use as a basic building block in electrical circuits for performing binary operations.

Many types of basic logic circuits are available in integrated circuit form, including emitter-coupled logic (ECL), direct-coupled transistor logic (DCTL(, diode-transistor logic (DTL), transistor-transistor logic (TTL), resistor-transistor logic (RTL), and complementary-transistor logic (CTL). To perform complex logical operations such as those required by a digital computer, basic logic circuits are connected in long circuit chains. The length and complexity of such circuit chains make it desirable that each logic circuit have certain features such as high speed, high noise immunity, wide operating temperature range, low power dissipation, low noise generation, and low cost. Furthermore, it is necessary that the binary signal not deteriorate or attenuate as it propagates through the chain.

Selection from the various types of basic logic circuits requires consideration of the advantages and disadvantages of the various logic circuits. Some of the disadvantages displayed by some types include high propagation time, low noise immunity, high power dissipation, slowdown with capacitive loading, extreme temperature sensitivity, lack of a wired-OR capability and signal attenuation.

CTL logic provides high speed, low power dissipation, a positive AND function, and wired-OR capability. However, a CTL gate has a tendency to oscillate under certain system configurations and it attenuates the logic signal. Furthermore, a CTL gate allows logic spikes to appear at the output when changing from one binary state to another and, in addition, requires transistors of both conductivity types. Moreover, the levels through CTL are not standardized as they pass through a number of levels.

Disclosed in a corresponding application entitled "DIGITAL LOGIC CIRCUIT HAVING INTERNAL COMPENSATION FOR SIGNAL DETERIORATION," Ser. No. 458,845, filed Apr. 8, 1974, and assigned to the assignee of the present invention is a logic circuit designed to replace CTL gates and avoid their disadvantages. In the above corresponding application, a logic circuit including a multi-emitter input transistor for determining a logical AND function of input signals and having wired OR capability is disclosed. As disclosed in the above copending application, provisions have been made to isolate the collector reactance of the multi-emitter input transistor from the remainder of the logic circuit. However, feedback from the output of the logic device to its input can still occur through the base circuit of the multi-emitter input transistor. In addition, output reflections from the gain circuit of the logic disclosed in the above-mentioned application are not isolated to prevent unwanted feedback.

It is, therefore, an object of the present invention to provide an improved logic circuit for performing a positive AND function and having a wired-OR capability.

It is a further object of this invention to provide a logic circuit in which the output of circuit is completely isolated from the input portion of the circuit.

SUMMARY OF THE INVENTION

Briefly, in accordance with the principles of the present invention, the logic circuit includes a first multi-emitter transistor for determining a logical AND function result at its collector, a second multi-emitter transistor connected to the collector, an output amplifier connected to a first emitter of the second multi-emitter transistor, and input-controlled level-shifting circuitry connected to a second emitter of the second multi-emitter transistor. Isolation of the collector reactance of the first multi-emitter transistor from the remainder of the logic circuit is provided by circuitry associated with the first emitter of the second multi-emitter transistor, and the base circuitry of the first multi-emitter transistor is isolated from the remainder of the logic circuit by the circuitry associated with the second emitter of the second multi-emitter transistor. The level shifting circuitry changes the relationship between the output and the inputs of the logic circuit in response to a predetermined input level for preventing output signal deterioration. As the input levels increase, the output levels also increase but remain below the input levels until the predetermined level is reached. Thereafter, the level shifting circuitry allows the output levels to increase at a proportionally greater rate than the input levels so that the output levels rise above the input levels until a limit, which is determined by the characteristics of the components of the circuit, is reached.

BRIEF DESCRIPTION OF THE DRAWINGS

These and other objects, advantages and features of the present invention will become more apparent to one skilled in the art from the following detailed description, together with the accompanying drawings in which.

DETAILED DESCRIPTION OF THE PREFERRED EMBODIMENT

Figure 1:
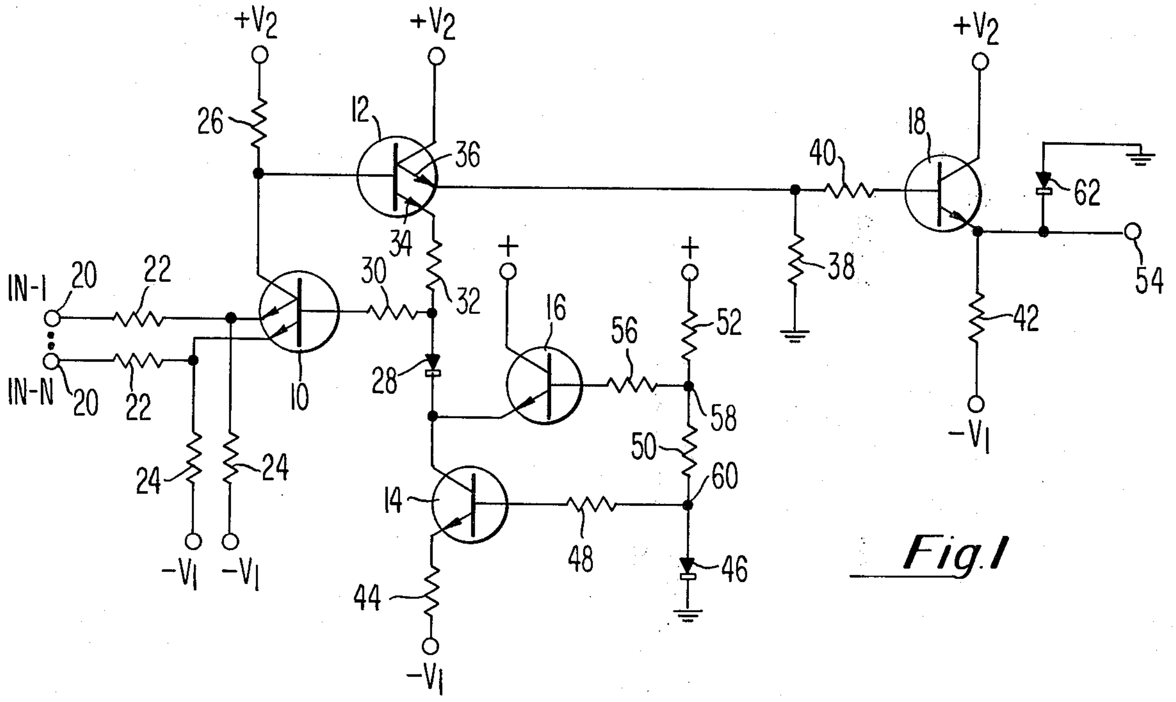
FIG. 1 is a circuit diagram of the preferred embodiment of the logic circuit of the present invention.

A positive "AND" gate according to the invention includes a pair of multi-emitter transistors 10 and 12, and three single emitter transistors 14, 16 and 18, all of the NPN type, see FIG. 1. Each of the multi-emitter transistors 10 and 12 has a plurality of emitter terminals, a single base terminal, a single collector terminal, a plurality of emitter-to-base junctions and a single base-to-collector junction coupled to all the emitter-to-base junctions by a single base region.

Input signals to the gate of the instant invention are applied to a plurality of input terminals 20 (IN-1 through IN-n), each of which in turn being connected via a resistor 22 to an emitter terminal of the multi-emitter transistor 10. Each of the emitters of multi-emitter transistor 10 are also connected to a source of negative potential $V_1$ via a resistor 24. The collector of multi-emitter transistor 10 is connected to a positive source of potential $V_2$ via a resistor 26. In addition, the collector of multi-emitter transistor 10 is connected to the base terminal of the multi-emitter 12, while the base terminal of multi-emitter transistor 10 is connected to the anode of a diode 28 via a resistor 30. Also connected to the anode terminal of diode 28 via a resistor 32 is an emitter terminal 34 of the multi-emitter transistor 12. The collector terminal of multi-emitter transistor 12 is directly connected to the positive source of potential $V_2$.

A second emitter terminal 36 of transistor 12 is connected to ground potential via a resistor 38. In addition, the base terminal of transistor 18 is also connected to second emitter terminal 36 via a resistor 40. The collector of transistor 18 is directly connected to the source of positive potential $V_2$, while the emitter of transistor 18 is connected to the negative source of potential $V_1$ via a resistor 42.

Returning to the diode 28, the cathode terminal of diode 28 is connected to the collector terminal of transistor 14 and the emitter terminal of transistor 16. The emitter terminal of transistor 14 is connected to the negative source of potential $V_1$ via a resistor 44, while the base terminal of transistor 14 is connected to the anode terminal of a diode 46, which provides temperature compensation for both transistors 14 and 16, via a resistor 48. The cathode terminal of diode 46 is connected to ground. Also connected to the anode terminal of diode 46 via a serial combination of resistors 56 and 50 is the base terminal of transistor 16. In addition, a resistor 52 is connected between the source of positive potential $V_2$ and junction between resistors 56 and 50.

When diode 28 is conducting, transistor 14 operates as a current sink for drawing current through the diode 28 and resistor 32. On the other hand, transistor 16 operates as a current source when diode 28 is non-conducting. The resistor 44 limits the current through transistor 14, and therefore the current through resistor 32, when diode 28 is conducting. Constant potential references are formed at a node 58 between resistors 50 and 52 and at a node 60 between resistor 50 and diode 46. These constant potential references at nodes 58 and 60 along with resistor 44 bias transistor 14 as a constant current sink.

Output signals from the gate of the instant invention are taken from an output terminal 54 which is connected to the emitter terminal of transistor 18.

Having now described the construction of the circuit of the instant invention, the operation of the circuit will next be described. In operation, the gate embodied in the instant invention performs the function of a conventional AND gate, i.e., provides a high level output signal only when all input signals are above a predetermined level. However, in describing the novel features of the present invention, assume for purposes of discussion that the $V_{be}$ for each transistor of the gate and the voltage drop for each diode of the gate is 0.7 volts. Also, assume for purposes of discussion that an input signal at ground potential is applied to the input terminal 20 corresponding to IN-1, while maintaining the remaining input terminals 20 (IN-2 through IN-n) at a positive level. Through the action of resistors 22 and 24 associated with input terminal IN-1, the input signal will be attenuated before reaching the emitter terminal of the multi-emitter transistor 10 by a ratio of the values of resistors 22 and 24. Thus, since the potential of the signal at input terminal IN-1 is at ground, the potential at the emitter terminal of the multi-emitter transistor 10 associated with input terminal IN-1 will be more negative than ground. The exact value of the potential at the emitter terminal will be a function of resistors 22 and 24, however, assume for purposes of discussion that the values of resistors 22 and 24 are such that a voltage drop of 0.4 volts is incurred. Thus, the signal appearing at the emitter terminal of multi-emitter transistor 10 associated with input terminal IN-1 will be 0.3 volts more negative than the signal at the input terminal IN-1.

From the emitter of transistor 10 to the base of transistor 10, a rise of 0.7 volts is seen. Therefore, the potential at the base terminal of multi-emitter transistor 10 will be substantially equal to +0.4 volts. Concurrently, due to the operation of transistors 14 and 16 and diode 28, which will be described in detail later, negligible current will flow through resistors 30 and 32 at this time. With negligible current flowing through resistors 30 and 32, the potential appearing at the first emitter terminal 34 of the multi-emitter transistor 12 will also equal substantially +0.4 volts. Moreover, since the first emitter terminal 34 of multi-emitter transistor 12 is at +0.4 volts, the potential at the second emitter terminal 36 of the multi-emitter transistor 12 should also be substantially equal to +0.4 volts, assuming both base to emitter drops are equal on transistor 12.

This +0.4 volts will also be seen at the junction of resistors 38 and 40. By selecting a transistor 18 with a high beta, the current flowing through resistor 40 will be negligible during this time period. Thus, +0.4 volts will also appear at the base terminal of transistor 18. However, a 0.7 volts drop will be seen from the base to emitter junction of transistor 18, resulting in a potential of −0.3 volts appearing at the emitter terminal of transistor 18. Thus, a signal at ground potential applied to the input terminal 20 of the gate of the instant invention, will result in an output signal of approximately −0.3 volts at the output terminal 54. This condition is shown as point "A" on a transfer curve T shown in FIG. 2. Note also from the transfer curve that the output signal level of the logic circuit of the instant invention will always be less than the input signal level as long as any input signal applied to any emitter of multi-emitter transistor 10 is below a predetermined level, the determination of which will be described later. This predetermined level is designated point "B" on the transfer curve. This is explained by the fact that as long as at least one input signal to an emitter of multi-emitter transistor 10 is below the level of point "B," current will continue to flow through resistor 26 to the collector of multi-emitter transistor 10, resulting in a low level signal being applied to the base of multi-emitter transistor 12. Since multi-emitter transistor 12 is operating as an emitter follower, the voltage at its emitter terminal 36 will also be low, thereby rendering transistor 18 non-conducting.

As all of the signals applied to the emitters of multi-emitter transistor 10 approach point "B," the current flow through resistor 26 decreases since all the emitter-base junctions are now being reversed-biased, thereby driving multi-emitter transistor 10 into a state of non-conduction. This in turn, raises the potential at the collector of transistor 10 which is also tied to the base terminal of transistor 12. As a result, multi-emitter transistor 12 is driven into a state of conduction. In addition, the potential at the base terminal of transistor 10 also increases at this time, and remains above the lowest value of any signal applied to the emitter terminals 20 of transistor 10.

As will now be described, diode 28 is non-conducting and will prevent substantially zero current to flow through resistor 32 until the lowest level of any signal applied to any input terminal 20 exceeds point "B" on the transfer curve. This is accomplished by selecting the appropriate potential to be applied to the cathode terminal of diode 28. The selecting function is performed by the combination of resistors 50, 52 and transistors 14 and 16, and more specifically, by the potential applied to the base terminal of transistor 16. This potential is obtained from the voltage divider created by resistors 50, 52 and diode 46. Since, as previously described, diode 46 is employed for temperature compensation for both transistors 14 and 16, the voltage drop across diode 46 is relatively constant. Therefore, the potential applied to the base terminal of transistor 16 is essentially that which is created by the resistive divider of resistors 50 and 52, since base resistor 48 conducts substantially negligible current. In addition, the potential applied to the base of transistor 16 is selected so that transistor 16 is only conducting when diode 28 is non-conducting. On the other hand, transistor 14 is biased, as previously described, so that is is a constant current sink and always conducting. Diode 28 will remain non-conducting until the potential at its anode terminal is greater than the potential applied to its cathode terminal by an amount substantially equal to the potential drop across the diode junction of diode 28. Thus, essentially zero current is flowing through resistor 32 when none of the signals at the emitters of multi-emitter transistor 10 exceeds a level represented by point "B" on the transfer curve with the result that the potentials at the anode of diode 28 and at the emitter terminal 34 are substantially the same.

As all the signals at the emitters of multi-emitter transistor 10 continue to increase and approach point "B," the potentials at the base of multi-emitter transistor 10 and at the base of multi-emitter transistor 12 also increases. Since the voltages at any of the emitters of multi-emitter transistor 10 is a function of its corresponding voltage at the input terminals 20, the input signal to the logic circuit having the lowest level is the controlling signal and current will flow through resistor 32 only after this lowest level input signal reaches the point where the signal at the emitters of multi-emitter transistor 10 is equal to the predetermined level respresented by point "B" on the transfer curve. Current flow through resistor 32 permits the emitter terminal 34 of multi-emitter transistor 12 to attain a potential level higher than the voltage level at the anode terminal of diode 28.

The base resistor 56 of current source transistor 16 conducts negligible current and the potential applied to the cathode terminal of diode 28 is essentially the potential at the reference node 58 less the potential drop across the base to emitter junction of transistor 16. Since the base resistor 30 of multi-emitter transistor 10 conducts substantially negligible current, the potential at the anode terminal of diode 28 is approximately one diode voltage drop above the lowest level emitter signal of the multi-emitter transistor 10. Moreover, since the potentials at the emitter of multi-emitter transistor 10 are a function of the voltage divider formed by resistors 22 and 24, it is readily apparent that the input voltage dividers determine the relationship between the inputs to the logic circuit and the potential applied to the anode terminal of diode 28. Furthermore, it is readily apparent that the input signal level necessary to render diode 28 conducting is determined by the values of resistors 50 and 52, which establish reference nodes 58 and 60, and by the values of the input potentials determined by the voltage divider formed by resistors 22 and 24.

As the lowest level input signal is such that the corresponding signal at the emitter-terminal is equal to the predetermined level, diode 28 begins to conduct and the potential at the anode terminal of diode 28 will increase with increasing input signals applied to the input terminals 20. As the input signals increase and the potential at the anode of diode 28 continues to increase, the current through resistor 32 also increases. Moreover, since diode 28 is now conducting, the potential at its cathode terminal also increases. This increasing potential at the cathode terminal of diode 28 tends to reverse-bias the emitter-base junction of transistor 16 and drives transistor 16 into a state of non-conduction. As transistor 16 is driven into non-conduction, the constant current sink transistor 14 begins to draw all of its current through resistor 32 via diode 28. Thus, the voltage across resistor 32 increases, thereby allowing the potential at the emitter terminal 34 of multi-emitter transistor 12 to increase above the voltage at the anode terminal of diode 28. As previously discussed, resistor 44 limits the current through current sink transistor 14, allowing a maximum voltage drop across resistor 32 to be reached.

Therefore, it can be seen that the potential at the emitter terminal 34 of multi-emitter transistor 12 remains close to the voltage at the base of multi-emitter transistor 10 until the lowest level input signal is sufficient to raise the potential at the base of multi-emitter transistor 10 to enable diode 28 to conduct. The resulting current flow through resistor 32 will enable the emitter terminal 34 of multi-emitter transistor 12 to reach a higher voltage. This level shifting at the emitter terminal 34 prevents deterioration of the output signal at output terminal 54, and eliminates the necessity of buffers between logic stages.

The output signal of multi-emitter transistor 12 is taken from emitter terminal 36 and transferred through the base resistor 40 to the output transistor 18, which in turn supplies a current gain to the logic circuit output. By utilizing the multi-emitter transistor 12, feedback from the output of the logic circuit is prevented. The emitter terminal 34 of multi-emitter transistor 12 serves to isolate the collector reactance of transistor 10 from the remainder of the logic circuit, thereby improving the stability of the logic circuit. Similarly, the emitter terminal 36 of multi-emitter transistor 12 serves to isolate the base of transistor 10 from the output portion of the circuit, thereby isolating the output reflections from the gain circuit, again to prevent unwanted feedback and to eliminate a possible source of oscillation.

With reference to resistor 22, which is part of the dividing networks in the input portion of the logic circuit, there is an additional function which is performed by resistor 22 besides providing the potential dividing necessary to create the proper d.c. output level. Resistor 22 also serves to dampen any oscillations that might be present in a system due to unterminated interconnect wires, as well as limit the gain of input transistor 10 to its linear region and to serve as a base resistor for multi-emitter transistor 12 when it is reflected to that node. In addition, the combination of resistors 22 and 24 aid in suppressing noise and for preventing spurious signals from affecting the logic circuit of the instant invention.

The output signal of the logic circuit of the instant invention is obtained at the emitter of transistor 18 and the low end of the output swing can be clamped by a diode 62, which has its cathode terminal connected to the emitter terminal of transistor 18, while its anode terminal is connected to ground potential. Thus, when a given minimum current flows through the transistor 18, the level at output terminal 54 drops to a point at which current begins to flow from ground through diode 62, thereby clamping output terminal 54 to a level offset from ground by the small voltage drop across diode 62. In addition, since the output of the logic circuit is from the emitter of output transistor 18, a plurality of outputs from several logic circuits of the present invention may be connected together to determine an OR function result of the plurality of inputs. This wired OR capability reduces the number of gates required to perform a given binary operation. Successive stages may be connected to nodes 58 and 60.

Figure 2:
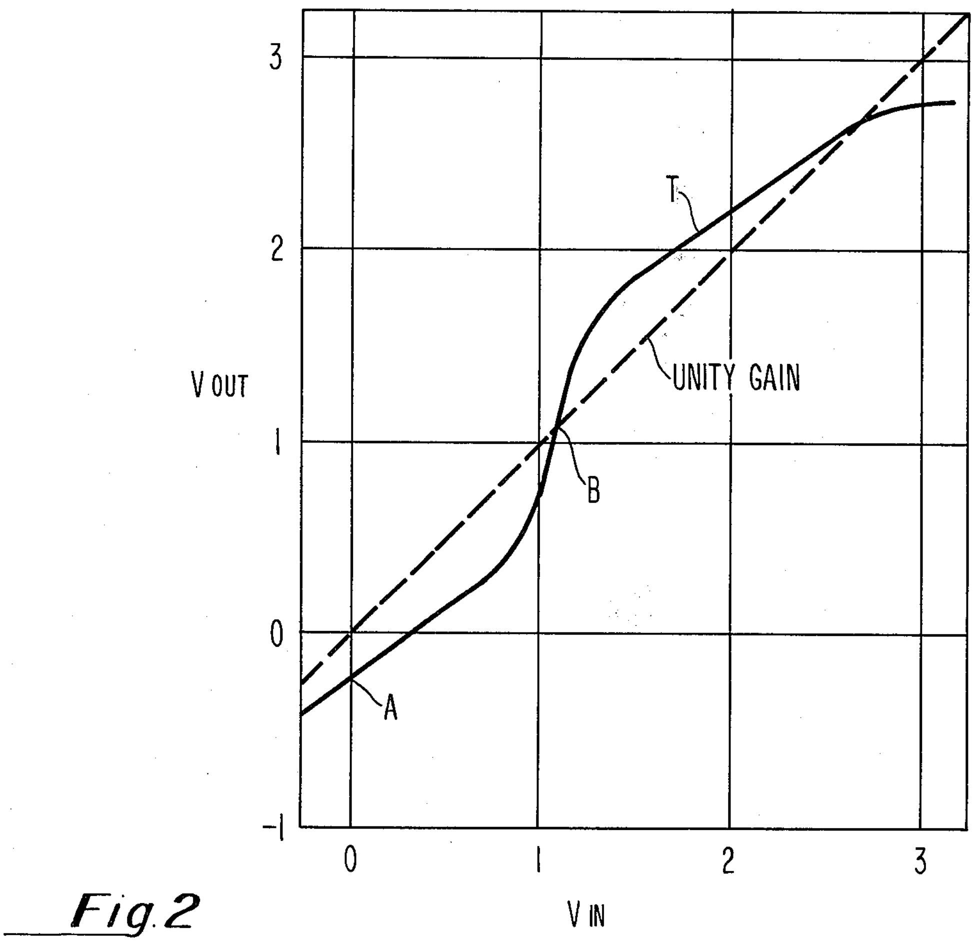
FIG. 2 is a graph of the transfer characteristic of the logic circuit of FIG. 1.

Thus it has been shown that gain is introduced into the logic circuit of the instant invention above the predetermined point "B," and that this point "B" can be accurately controlled through the selection of resistors 50 and 52, which in turn determine the potential at the anode terminal of diode 28 necessary to render the diode conducting. Since gain can be introduced above a certain input potential to the emitters of the multi-emitter transistor 10, then theoretically, with more and more successive stages in a series string, the output on each succeding stage would be greater than the previous one. In reality however, a limit is reached when the output level rises to a point where it equals $V_{CC}$ - ($V_{be}$ T12 + $V_{be}$ T18). This feature is shown in FIG. 2. Thus, the output of the logic circuit of the instant invention initially remains below the lowest level of the input signal applied to the logic circuit until the lowest level input signal is sufficient to render diode 28 conductive. At that point, the output signal of the logic circuit increases at a greater rate than the input signal and reaches a level which is significantly higher than the level of the lowest level input signal. After the output of the circuit reaches the limit discussed above, the rate of increase decreases and its value approaches that of the input signal. Thus, the logic circuit of the present invention has the positive AND input function made possible by the using of multi-emitters and has inherent positive output OR tying capability and will produce a standardized output capble of large fanouts at minimum delays with low power dissipation.

While the invention has been particularly shown and described, it will be understood by those skilled in the art that various changes in form and details of the logic may be made therein without departing from the spirit and scope of the invention.

What is claimed is:

1. A logic circuit for processing a plurality of binary signals comprising:
- a plurality of input terminals for receiving said plurality of binary signals and an output terminal;
- a plurality of signal attenuating means coupled to said plurality of input terminals for damping oscillations at said plurality of input terminals;
- a plurality of emitter-to-base junctions having a single base region coupled to said plurality of signal attenuating means for determining a logical function with respect to said plurality of binary signals applied to said plurality of input terminals;
- a collector-to-base junction common with said single base region for providing a signal responsive to said determined logical function; and
- a first and second emitter-to-base junction having a common base region directly coupled to said collector-to-base junction; said first emitter-to-base junction for isolating the collector reactance of a transistor formed by said single base region, said collector-to-base junction and said plurality of emitter-to-base junctions from said output terminal; said second emitter-to-base junction for isolating said single base region from said output terminal.

2. A logic system comprising:
- a source of binary signals;
- first transistor means having a collector terminal, a base terminal, a plurality of emitter terminals, and a single base region;
- first means for applying between said base terminal and each of said plurality of emitter terminals said source of binary signals;
- second transistor means having a first and a second emitter terminal and a common base region coupled to said collector terminal, said collector terminal being coupled to said common base region;
- second means coupled to said first emitter terminal and said base terminal and responsive to said first means and said source of binary signals for controlling the gain of said logic system; and
- third means coupled to said second emitter terminal and responsive to said source of binary signals and said first transistor means for providing an output signal for said logic system.

3. The logic system of claim 2 wherein a path between said collector terminal and said first emitter terminal includes means for isolating the collector reactance of said first transistor means from said third means.

4. The logic system of claim 2 wherein a path between said collector terminal and said second emitter terminal includes means for isolating said single base region from said third means.

* * * * *